United States Patent [19]

McCain

[11] Patent Number: 5,187,564
[45] Date of Patent: * Feb. 16, 1993

[54] APPLICATION OF LAMINATED INTERCONNECT MEDIA BETWEEN A LAMINATED POWER SOURCE AND SEMICONDUCTOR DEVICES

[75] Inventor: Joseph H. McCain, Plano, Tex.

[73] Assignee: SGS-Thomson Microelectronics, Inc., Carrollton, Tex.

[*] Notice: The portion of the term of this patent subsequent to Oct. 6, 2009 has been disclaimed.

[21] Appl. No.: 782,570

[22] Filed: Oct. 25, 1991

Related U.S. Application Data

[63] Continuation-in-part of Ser. No. 736,412, Jul. 26, 1991, Pat. No. 5,153,710.

[51] Int. Cl.$^5$ .................... H01L 23/16; H01L 23/48; G11C 7/00
[52] U.S. Cl. .................... 174/260; 365/226; 365/227; 365/228; 365/229; 257/924; 429/163
[58] Field of Search ............... 365/226, 227, 228, 229; 357/70, 75, 72

Primary Examiner—Andrew J. James
Assistant Examiner—Carl Whitehead, Jr.
Attorney, Agent, or Firm—Dennis T. Griggs; Lisa K. Jorgenson; Richard K. Robinson

[57] ABSTRACT

A flat geometry interconnect media connects the electrodes of a laminated power source in electrical contact with positive and negative power input terminals on a planar substrate. The interconnect media is in the form of a flexible, laminated strip having a central conductive lamina sandwiched between a pair of insulation laminae. The flexible, laminated interconnect media is folded about the anode and cathode of the laminated power source for presenting positive and negative battery terminals in substantially coplanar relation for electrical contact with substrate lands or metallization deposits situated on one side of a printed circuit board. The laminated battery supplies backup operating power to integrated circuit devices such as static random access memories.

16 Claims, 3 Drawing Sheets

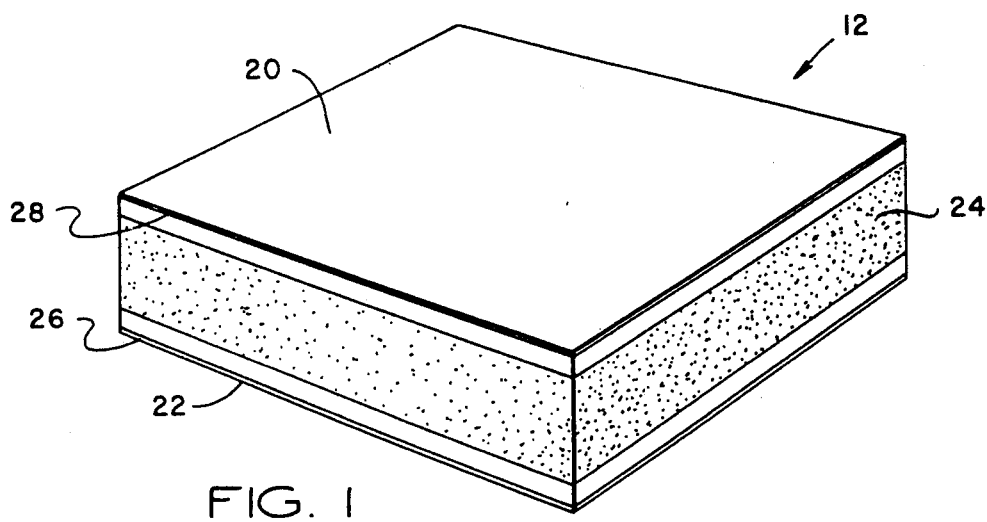
FIG. 1
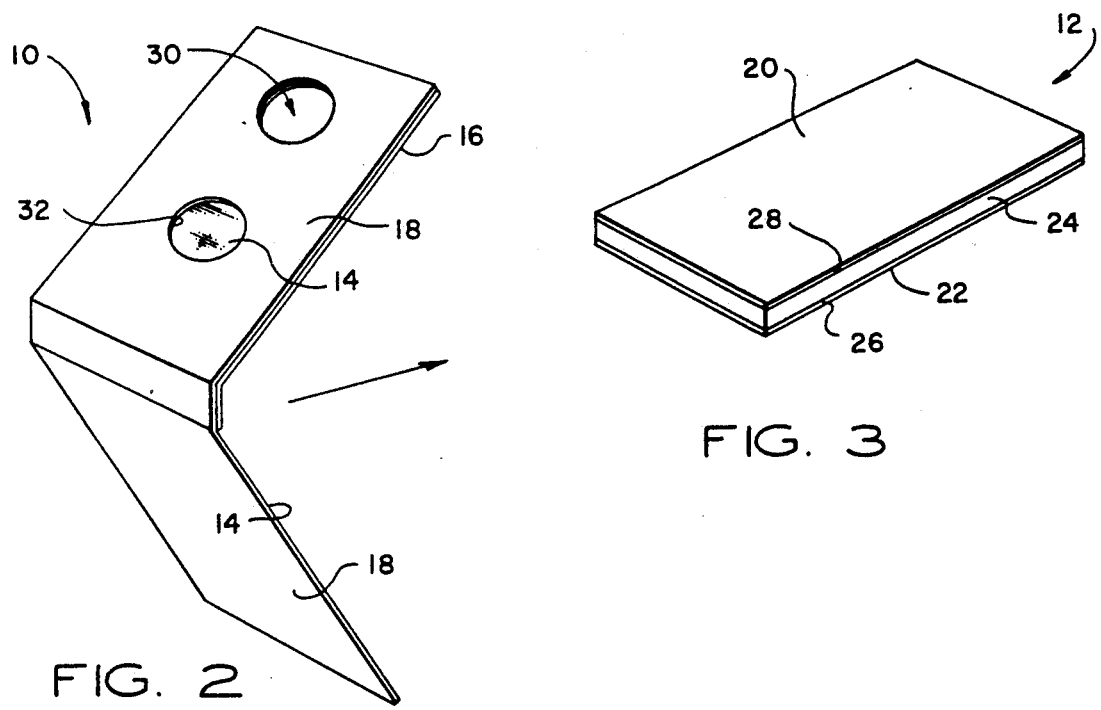
FIG. 2
FIG. 3
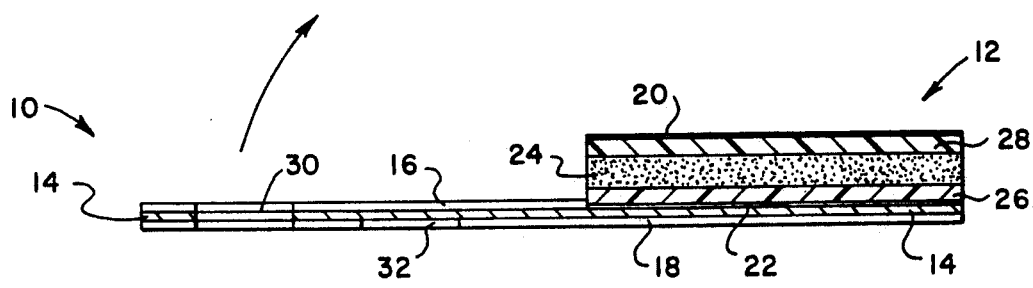
FIG. 4

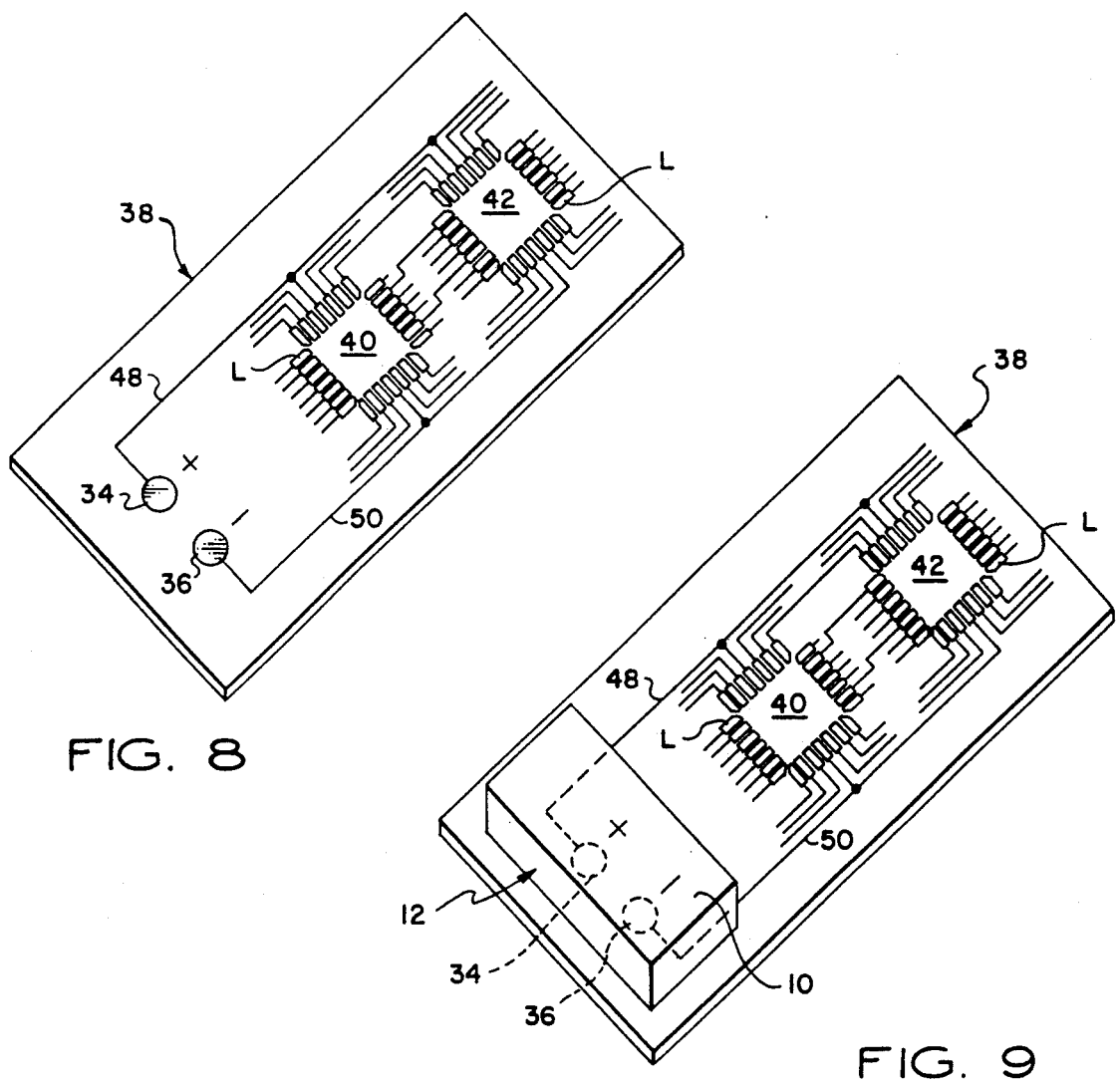
FIG. 8
FIG. 9
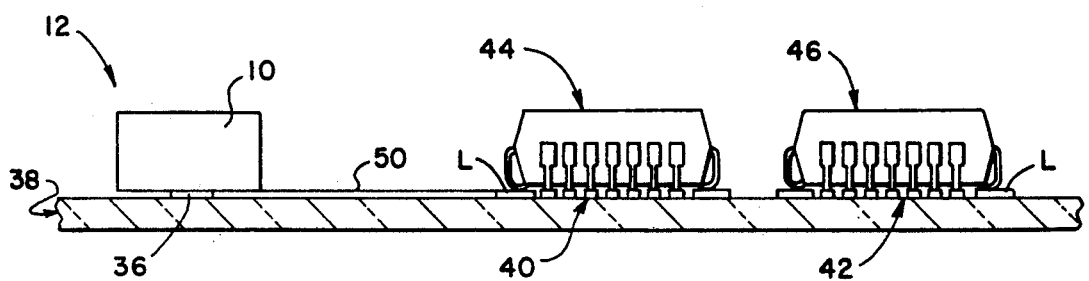
FIG. 10

APPLICATION OF LAMINATED INTERCONNECT MEDIA BETWEEN A LAMINATED POWER SOURCE AND SEMICONDUCTOR DEVICES

CROSS REFERENCE TO RELATED APPLICATION

This application is a continuation-in-part of application Ser. No. 07/736,412 filed Jul. 26, 1991, U.S. Pat. No. 5,153,710.

FIELD OF THE INVENTION

This invention relates generally to electronic assembly technology, and in particular to interconnect media for secondary cells which provide standby power to integrated circuit devices.

BACKGROUND OF THE INVENTION

An important integrated circuit product which is implemented on an integrated circuit (IC) chip includes a volatile semiconductor memory known as a static random access memory (SRAM). The SRAM is characterized by low standby power consumption and high memory cell density. The generation of valid logic signals and the retention of data in such integrated memory circuits having volatile memory cells depend in part on maintenance of power supply voltages within specified limits. In conventional integrated circuit memory devices, internal circuits sense the external source voltage being applied to determine if it is sufficient for reliable operation. In response to a low voltage condition, control signals are generated which cause active chips to be deselected and maintained in standby condition. This is usually carried out by means of true and complement chip select signals, CS and CS, respectively, which inhibit read/write operations until the low voltage condition has been corrected.

During the period that a memory chip is in the unselected condition, it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be reestablished.

DESCRIPTION OF THE PRIOR ART

It has been proposed to solve the data loss problem by encapsulating a backup battery within the semiconductor chip package. In one such construction, a memory chip having volatile memory cells is loaded onto the die paddle of a lead frame and wires are bonded between I/O pads and respective internal leads. The lead frame and IC chip are encapsulated by resin within one molded half section. A small battery and other discrete components, for example, a crystal, are mounted within a second half section. The second half section includes connector pins accurately positioned for engaging finger leads in the lead frame of the first molded half section. The dual section arrangement has served well for many product applications which require the use of Non-Volatile SRAM. However, the additional height imposed by the second half section produces a package which exceeds the maximum height limit established for critical space, high density product applications.

The data loss problem has been solved in conventional through-hole PC circuit boards by installing a conventional secondary cell, for example, a nickel-cadmium "button" cell in a socket mounted on a through-hole PC circuit board. In some applications, the battery electrodes are equipped with solder tags, and others are connected by wire conductors to positive and negative power terminals on the printed circuit board. Such socket and wire connections are not well adapted to automatic assembly techniques used in the fabrication of high density printed circuit boards.

Printed circuit board technology and surface mount technology have evolved to satisfy high density packaging specifications. Surface mount devices including memory chips are packaged in flat packs and leadless chip carriers, which have replaced the dual-in-line package in such applications. The surface mount flat packs and leadless chip carriers have a low profile, and they can be attached to both sides of a printed circuit board, thereby substantially increasing circuit density per square unit area per assembly as compared with conventional through-hole PC board technology.

Such surface mount devices, sometimes called surface mount components, can be any electrical component, leaded or leadless, mounted on one or both sides of a substrate and interconnected to substrate lands or metallizations by a lap solder joint. Consequently, a surface mount device makes metallurgical contact only on the substrate side on which it is mounted.

The geometry of conventional secondary (rechargeable) cells is not well adapted for use in connection with surface mount PC boards. Conventional secondary cells typically have an elongated cylindrical construction or a compact "button" construction in which the anode and cathode are not coplanar. Conventional nickel-cadmium secondary cells may be used in combination with a socket, or the battery electrodes may be equipped with solder tags.

Recently, an improved rechargeable battery which utilizes conductive polymers in a laminated cell structure has been demonstrated. The rechargeable, conductive polymer battery utilizes a solid polymer electrolyte core which is sandwiched between layers of a polymer film cathode material and a polymer film anode material. The contact electrodes are formed by conductive foil and conductive film laminate.

The flat geometry, package height and ampere hour charge capacity of such solid polymer electrolyte secondary cells are well suited for surface mount printed circuit board applications. However, since their electrodes are not coplanar, a compatible coupling media is needed to adapt such rechargeable, conductive polymer batteries for use in combination with surface mount printed circuit boards.

OBJECTS OF THE INVENTION

Accordingly, the principal object of the present invention is to provide a flat geometry interconnect media for connecting the electrodes of a laminated power source in electrical contact with positive and negative power input terminals on a planar substrate.

A related object of the present invention is to provide an interconnect media for adapting a laminated, conductive polymer battery for surface mount attachment to substrate surface lands disposed on one side of a printed circuit board.

Another object of the present invention is to provide an interconnect media for attachment to the anode and cathode of a laminated power source for presenting positive and negative battery terminals for coplanar contact with substrate lands or metallization deposits situated on one side of a printed circuit board.

Yet another object of the present invention is to provide a flexible interconnect media for connecting the anode and cathode of a laminated power source to power input terminals on a printed circuit board.

SUMMARY OF THE INVENTION

The foregoing objects are satisfied by an electrical interconnect media in the form of a flexible, laminated strip having a central conductive lamina sandwiched between a pair of insulation laminae. The multi-layer laminated strip is flexible so that it can be folded about the anode and cathode of a laminated power source for presenting positive and negative battery terminals in substantially coplanar relation for electrical contact with substrate lands or metallization deposits situated on one side of a printed circuit board.

In the preferred embodiment, a section of insulation lamina is removed and the cathode of the battery is loaded on and electrically bonded to the exposed conductive lamina. An intermediate section of the flexible interconnect media is folded around the edge of the laminated battery, with the conductive lamina being separated from the battery anode by the inside insulation lamina. The laminae of the interconnect media are intersected by an aperture, which exposes the underlying battery anode. The outer insulation lamina is also intersected by an aperture, thereby exposing the conductive lamina, which is in electrical contact with the battery cathode. According to this arrangement, the exposed battery anode and the exposed conductive laminae present positive and negative battery terminals in substantially coplanar relation, for electrical contact with substrate lands or metallization deposits situated on one side of a printed circuit board. The flexible interconnect media thus constitutes an electrical wrap which simultaneously insulates the battery cathode with respect to the anode, while presenting electrical contact surfaces substantially in coplanar relationship for surface mount applications.

Operational features and advantages of the present invention will be appreciated by those skilled in the art upon reading the detailed description which follows with reference to the attached drawings, wherein:

BRIEF DESCRIPTION OF THE DRAWINGS

FIG. 1 is a perspective view of a solid polymer electrolyte secondary cell;

FIG. 2 is a perspective view of a laminated interconnect media shown in a partially folded condition in preparation for folding attachment to a laminated power source;

FIG. 3 is a simplified perspective view of a laminated power source;

FIG. 4 is a sectional view which illustrates loading the cathode of a laminated power source onto the exposed conductive lamina of the interconnect media shown in FIG. 2;

FIG. 8 is a perspective view of a printed circuit board having surface mount lands arranged for engagement with a surface mountable plastic leadless chip carrier (PLCC) memory device, and having metallization deposits defining positive and negative power input terminals;

FIG. 9 is a view similar to FIG. 8 in which the laminated secondary cell of FIG. 5 is surface mounted in electrical contact with the positive and negative power input terminals; and, FIG. 10 is an elevational view which illustrates the installation of two surface mountable PLCC memory devices and a laminated secondary cell on the printed circuit board of FIG. 8.

DETAILED DESCRIPTION OF THE PREFERRED EMBODIMENT

Figure 5:
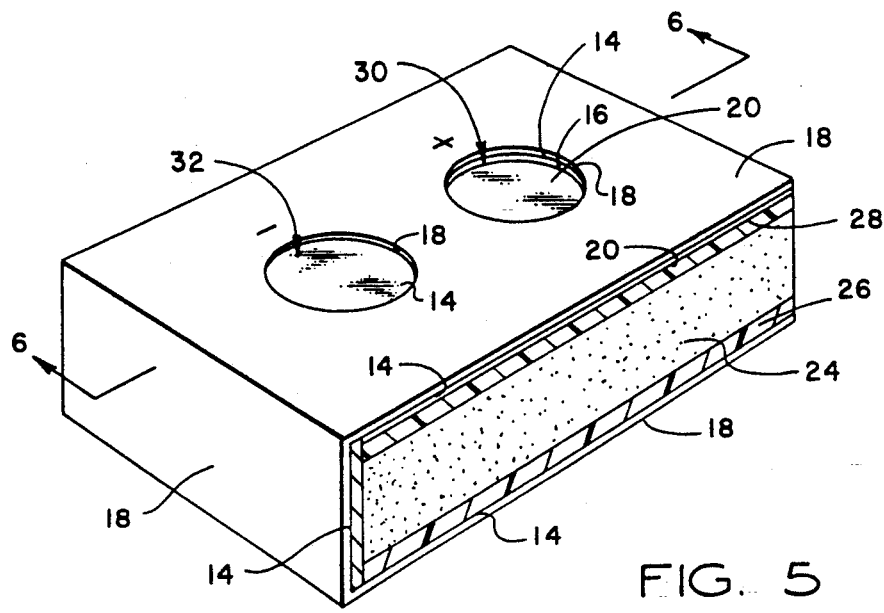
FIG. 5 is a perspective view of a laminated power source loaded between the folded sections of the laminated interconnect media of FIG. 2.

In the description which follows, like parts are indicated throughout the specification and drawings with the same reference numerals, respectively. By way of example, the invention is described in combination with a laminated, rechargeable conductive polymer battery for providing backup power to a pair of surface mountable PLCC static random access memory (SRAM) devices. It will be appreciated, however, that the interconnect media of the invention may be used to provide backup battery power for other volatile memory integrated circuit devices having multiple input/output nodes. Accordingly, it should be understood that the invention and its broadest aspects may be utilized in combination with laminated power sources in general and other circuit devices which require backup power, including but not limited to discrete, micro-discrete and integrated circuit components, and hybrid combinations of such discrete and integrated devices.

Referring now to FIG. 1–FIG. 4, a laminated interconnect media 10 is adapted for folding engagement about a laminated power source 12. The interconnect media 10 is in the form of a flexible, laminated strip having a central conductive lamina 14 sandwiched between a pair of insulation laminae 16, 18. In the preferred embodiment, the conductive laminate 14 is a foil or film of a conductive metal such as copper, silver or aluminum. Each insulation lamina is preferably paper or a non-conductive polyester film such as Mylar ® manufactured by DuPont de Nemours, E. I. & Co. The insulation laminae 16, 18 are bonded to the conductive lamina 14 by a heat sealing adhesive. The multi-layer laminated strip 10 is flexible so that it can be folded about the anode 20 and cathode 22 of the laminated battery 12.

The laminated power source 12 shown in FIG. 1 is a conductive polymer, rechargeable secondary cell. A film preparation 24 of lithium perchlorate ($LiClO_4$) mixed with polyvinylidene ($LiClO_4$-PVDF) is used as the solid electrolyte. The solid electrolyte 24 is sandwiched between two polyacetylene $(CH)x$ films 26, 28 which define cathode and anode electrolyte layers 26, 28. The cathode electrolyte layer 26 is impregnated with n-type impurities for conductivity. The cathode film layer is bonded to an aluminum film layer 26 which constitutes the negative terminal. The anode layer 28 is impregnated with p-type impurities for conductivity, and is bonded to a 2,000 Å evaporated gold film which constitutes the positive terminal 20.

For a laminated rechargeable, or secondary, cell having a lithium perchlorate electrolyte measuring 0.300 inch wide, 0.300 inch long and 0.053 inch high has an energy capacity of between 2 and 4 mAhrs. Cell capacity is directly proportional to the mAhrs electrolyte layer thickness as well as the thickness of the sealed edge of the cell.

The anode terminal 20 and the cathode terminal 22 are not coplanar; consequently, the interconnect media 10 is folded onto the anode and cathode for presenting positive and negative battery terminals for coplanar contact with substrate lands or metallization deposits situated on one side of a printed circuit board.

Referring to FIG. 4, a section of insulation lamina is removed from the insulation lamina 16, thereby exposing the surface of the conductive lamina 14. The cathode 22 of the battery 12 is loaded onto and bonded to the exposed conductive lamina 14. The flexible interconnect media 10 is then folded around the edge of the laminated battery, with the conductive lamina 14 being separated from the battery anode 20 by the insulation laminate 16.

The laminae of the interconnect media 10 are intersected by an aperture 30, which exposes the underlying battery anode 20. The outer insulation lamina 18 is also intersected by an aperture 2, thereby exposing the conductive lamina 14.

Figure 6:
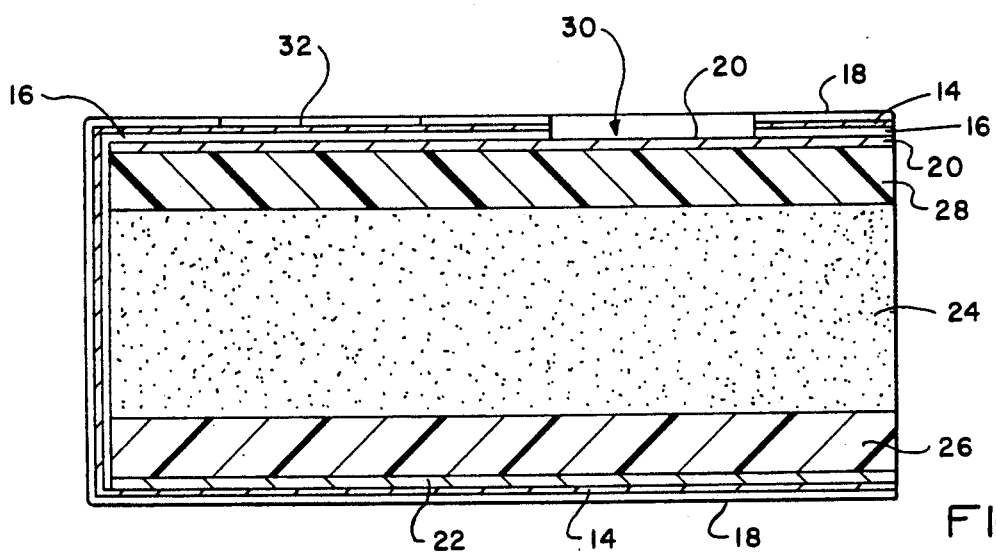
FIG. 6 is a sectional view of the laminated power source and interconnect media shown in FIG. 5, taken along the line 6—6.
Figure 7:
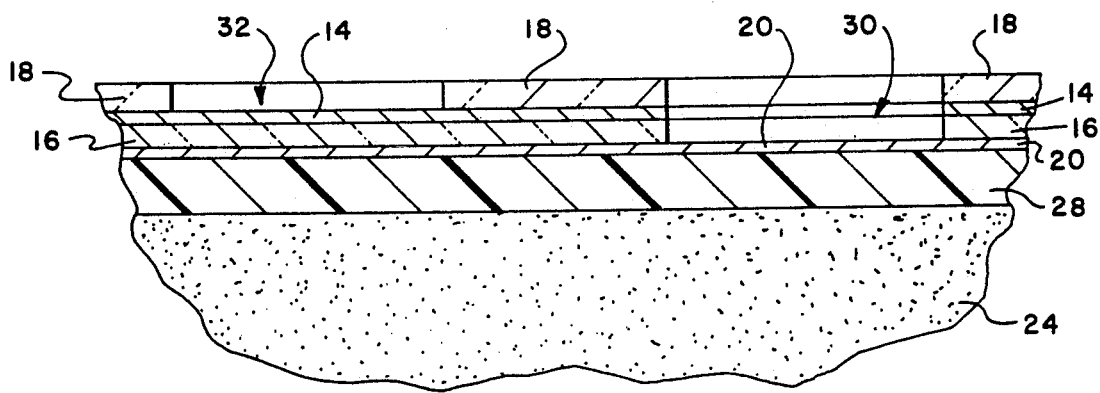
FIG. 7 is an enlarged sectional view which illustrates coplanar exposure of the anode and the conductive lamina of the interconnect media.

Referring to FIG. 5, FIG. 6 and FIG. 7, the battery anode surface 20 exposed by the aperture 30 and the conductive lamina 14 exposed by the aperture 32 present positive and negative battery terminals in substantially coplanar relation for contact with coplanar substrate lands or metallization deposits. The flexible interconnect media 10 simultaneously insulates the battery cathode 22 with respect to the anode 20, while presenting electrical contact surfaces 14, 20 substantially in coplanar relation, for contact with metallization deposits 34, 36 which are situated on one side of a printed circuit board 38 as shown in FIG. 8.

Referring now to FIG. 8, FIG. 9 and FIG. 10, the laminated power source 12 is adapted for surface mount attachment to the positive and negative power input terminals 34, 36, which are bonded to one side of the printed circuit board 38. Also formed on the same side of the printed circuit board 38 are two groups 40, 42 of conductive lands L arranged in a pattern for engaging the external J-leads of 28-pin, surface-mountable PLCC memory devices 44, 46, which in this exemplary embodiment are static random access memories (SRAM). The PC board 38 also includes conductive traces 48, 50 which conduct standby operating current to the SRAM memory devices 44, 46. The printed circuit board 38 also includes other conductive signal traces and interconnection traces between the SRAM devices and edge interconnects.

Electrical contact between the exposed cathode and anode contact surfaces 14, 20 with the positive and negative power input terminals 34, 36 is provided by a deposit of conductive epoxy adhesive. The conductive adhesive is preferably silver-filled epoxy adhesive such as Amicon CT-5047-2. The conductive lands in the groups 40, 42 and the conductive traces are bonded to the surface of the insulating substrate 38. The substrate 38 is preferably constructed of a material having a high glass transition temperature ($T_g$), for example, G-30 polyimide, and having good laminate compliancy, for example, as provided by Kevlar ® epoxy or Kevlar ® polyimide fiber.

Referring again to FIG. 10, it will be appreciated that the flat geometry of the interconnect media 10 is well adapted for use in combination with surface mount printed circuit boards. Moreover, the solid polymer electrolyte secondary cell and interconnect media combination has a low profile and occupies a relatively small area on only one side of the printed circuit board. Solder tags and external wiring leads are not required. Its packaging height is less than the packaging height of the surface mount PLCC memory devices.

Although the invention has been described with reference to a specific embodiment, and with reference to a specific SRAM backup battery application, the foregoing description is not intended to be construed in a limiting sense. Various modifications of the disclosed laminated battery package and interconnect media as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. An interconnect media for connecting the electrodes of a power source in electrical contact with positive and negative power input terminals on a planar substrate comprising a flexible, laminated strip having a central conductive lamina sandwiched between first and second insulation laminae, with a portion of the first insulation lamina being removed, thereby exposing the surface of the conductive lamina for engaging one of the power source electrodes, and the laminated strip being intersected by a first aperture for exposing the other power source electrode, and the second insulation lamina being intersected by a second aperture, thereby exposing the conductive lamina.

2. An interconnect media as defined in claim 1, wherein the central conductive lamina comprises a foil of a conductive metal selected from the group consisting of copper, silver and aluminum.

3. An interconnect media as defined in claim 1, wherein the central conductive lamina comprises a metalized film of a conductive metal selected from the group consisting of copper, silver and aluminum.

4. An interconnect media as defined in claim 1, wherein the first and second insulation laminae comprise paper.

5. An interconnect media as defined in claim 1, wherein the first and second insulation laminae comprise polyester film.

6. An interconnect media as defined in claim 1, wherein the insulation laminae are bonded to the conductive lamina by a heat sealing adhesive.

7. A battery package comprising, in combination: an electrolyte body sandwiched between a cathode lamina and an anode lamina; and,
 a laminated interconnect media having a central conductive lamina sandwiched between first and second insulation laminae, with a portion of the first insulation lamina being removed, thereby exposing a surface of the conductive lamina, said laminated interconnect media being folded about the cathode and anode laminae, with a selected one of the anode and cathode laminae being disposed in electrical contact with the exposed surface of the conductive lamina, and with one of the insulation laminae covering the other one of the anode and cathode laminae.

8. A battery package as defined in claim 7, the interconnect media being intersected by a first aperture thereby exposing the surface of the other one of the anode and cathode laminae, and the second insulation lamina being intersected by a second aperture, thereby exposing the central conductive lamina.

9. A battery package as defined in claim 7, wherein the central conductive lamina comprises a foil of conductive metal selected from the group consisting of copper, silver and aluminum.

10. A battery package as defined in claim 7, wherein the central conductive lamina comprises a conductive metal film.

11. A battery package as defined in claim 7, wherein the insulation laminae comprise paper.

12. A battery package as defined in claim 7, wherein the insulation laminae comprise polyester film.

13. A battery package as defined in claim 7, wherein the insulation laminae are bonded to the central conductive lamina by a heat sealing adhesive.

14. In an electronic circuit of the type having an array of conductive traces formed on a substrate for conducting signals and standby operating power to the input/output terminals of a semiconductor device, and having coplanar DC power input terminals disposed on said substrate, the improvement comprising a laminated secondary cell mounted on said substrate, said laminated cell having a cathode lamina, an anode lamina and an interconnect media connecting the anode and cathode laminae in electrical contact with the positive and negative power input terminals, respectively.

15. The combination as defined in claim 14, said interconnect media comprising a central conductive lamina sandwiched between first and second insulation laminae, with a portion of the first insulation lamina being removed, said laminated interconnect media being folded about the cathode and anode laminae, with a selected one of the laminae being mounted in electrical contacting engagement against the exposed surface of the conductive interconnect lamina, and with the other one of the anode and cathode laminae being covered by an insulation lamina of the interconnect media.

16. The combination as defined in claim 14, the interconnect media being intersected by a first aperture for exposing the surface of a selected one of the anode and cathode laminations, and the second insulation lamina being intersected by a second aperture, thereby exposing the surface of the central conductive lamina.

* * * * *